United States Patent [19]
Bothra et al.

[11] Patent Number: 5,834,356
[45] Date of Patent: Nov. 10, 1998

[54] METHOD OF MAKING HIGH RESISTIVE STRUCTURES IN SALICIDED PROCESS SEMICONDUCTOR DEVICES

[75] Inventors: Subhas Bothra, San Jose; Dipankar Pramanik, Saratoga; Xi-Wei Lin, Fremont, all of Calif.

[73] Assignee: VLSI Technology, Inc., San Jose, Calif.

[21] Appl. No.: 883,814

[22] Filed: Jun. 27, 1997

[51] Int. Cl.⁶ .................................................. H01L 21/20
[52] U.S. Cl. ........................ 438/384; 438/382; 438/586; 438/655
[58] Field of Search .................................. 438/683, 585, 438/586, 589, 301, 306, 238, 382, 655, 383, 384, 385

[56] References Cited

U.S. PATENT DOCUMENTS

| | | | |
|---|---|---|---|
| 3,792,319 | 2/1974 | Tsang | 317/235 R |
| 4,042,950 | 8/1977 | Price | 357/51 |
| 5,227,327 | 7/1993 | Sasaki | 437/60 |
| 5,232,865 | 8/1993 | Manning et al. | 437/60 |
| 5,266,156 | 11/1993 | Nasr | 156/656 |
| 5,330,930 | 7/1994 | Chi | 437/60 |
| 5,397,722 | 3/1995 | Bashir et al. | 437/41 |
| 5,413,969 | 5/1995 | Huang | 437/200 |
| 5,506,167 | 4/1996 | Chen et al. | 437/60 |
| 5,521,117 | 5/1996 | Kapoor | 437/60 |
| 5,547,881 | 8/1996 | Wang et al. | 438/384 |
| 5,605,854 | 2/1997 | Yoo | 437/44 |
| 5,705,411 | 1/1998 | Wang et al. | 438/384 |

OTHER PUBLICATIONS

L. Van Den Hove, "*Advanced Interconnection and Contact Schemes Based on TiSi₂ and CoSi₂: Relevant Materials Issues and Technological Implementation*", Katholieke Universiteit Leuven, IMEC, pp. 144–153, Jun. 1988.

*Primary Examiner*—Jey Tsai
*Assistant Examiner*—Lynne A. Gurley
*Attorney, Agent, or Firm*—Hickman & Martine, LLP

[57] ABSTRACT

Disclosed is a method for making a high resistive structure in a salicided process. The method includes providing a substrate including at least one active device having diffusion regions and a polysilicon gate structure. Depositing a metallization layer over the substrate including at least one active device. Annealing the substrate to cause at least part of metallization layer to form a metallization silicided layer over the substrate that includes the at least one active device. Preferably, the metallization silicided layer lying over the diffusion regions and the polysilicon gate produces a substantially decreased level of sheet resistance. The method also includes forming a mask over the metallization silicided layer, and the mask being configured to leave a portion of the metallization silicided layer that overlies at least one active device exposed. Further, the method includes etching the substrate in order to remove the exposed metallization silicided layer overlying the at least one active device to produce a substantially increased level of sheet resistance over the at least one active device not having the metallization silicided layer.

21 Claims, 6 Drawing Sheets

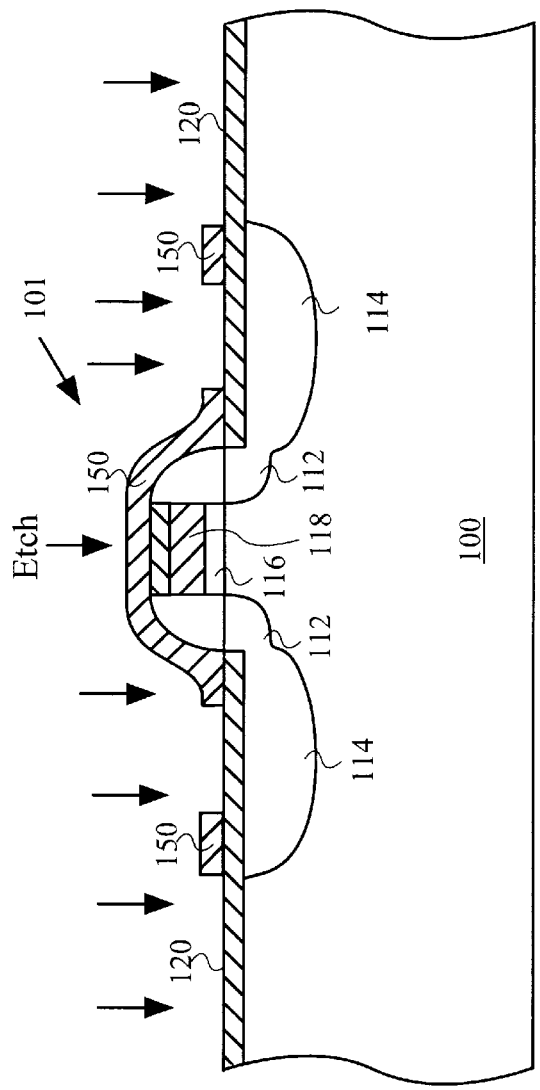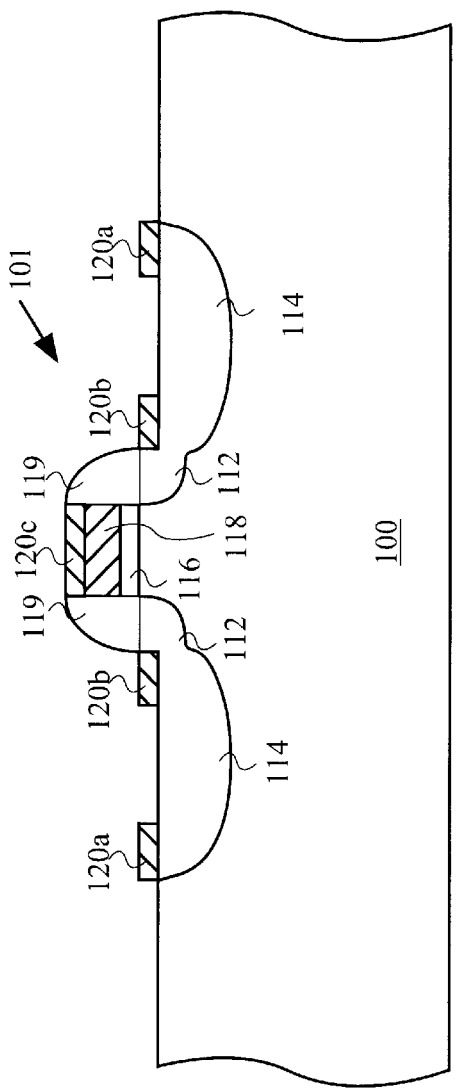

METHOD OF MAKING HIGH RESISTIVE STRUCTURES IN SALICIDED PROCESS SEMICONDUCTOR DEVICES

BACKGROUND OF THE INVENTION

1. Field of the Invention

The present invention relates generally to semiconductor circuits and, more particularly, to a method of forming a high resistive structure in a salicided process, and a semiconductor device including a high resistive structure formed by such method.

2. Description of the Related Art

The trend in integrated circuit technology toward smaller feature sizes is approaching the use of 0.25 μm process technology features and smaller. As the dimensions of features such as silicon lines and diffusion areas become smaller, however, the resistance of such features increases. In devices formed in a core region of a silicon chip, the resistance is generally kept as low as possible so that such devices can operate at high speeds. To obtain higher operating speeds, the resistance of small feature devices is typically lowered by introducing a "salicide" (i.e., self-aligned silicide) formation technique into the fabrication process flow. In the salicide process, a refractory metal, e.g., titanium, is reacted with the silicon in the active regions of the device and the polysilicon gates of the active devices to form a refractory titanium silicide layer. As a result, the silicided active regions and polysilicon gates may attain a resistivity that is as low as 2 to 5 ohms per square, thereby improving the operating speeds of devices in the core region of the chip.

While improved performance is achieved for core region devices, there are many designs that require high resistance structures in the core region as well as in an input/output (I/O) region that is typically defined along the periphery of the chip. For example, many devices in the I/O region are generally required to withstand excess energy events known as electrostatic discharge (ESD). An excess energy event is a surge of power, often caused by a voltage or a current, which can damage the semiconductor device chip itself, or can lead to degradation or failure of metal contacts associated with a device.

FIG. 1 is a cross section view of a conventional device that has been subjected to the aforementioned salicided process. As shown, a substrate 10 is includes a pair of diffusion regions 14 and a pair of lightly doped drains (LDD's) 12 formed in a conventional manner. The device includes a polysilicon gate 18 that that is formed over an oxide layer 16, and a pair of oxide spacers 19 that assist in the formation of the LDD's 12. As described above, the device includes a titanium silicide layer 20 formed over the pair of diffusion regions 14 and polysilicon gate 18. It should be noted that the titanium silicide layer 20 will not react with oxide, and therefore, the oxide spacers 19 act as a mask where no titanium silicide is formed. Once the titanium silicide layer 20 is formed over non-oxide covered regions, an inter-metal dielectric layer 22 is formed over the titanium silicide layer 20 and any oxide regions (i.e., oxide spacers 19 and other exposed oxide regions). After the inter-metal dielectric layer 22 is formed, vias are defined and filled with metallization to define contacts 24 leading down to the pair of diffusion regions 14.

Because the device of FIG. 1 may be used in the I/O region, it is oftentimes exposed to high energy ESD events. When this happens, it believed that the metal present in the titanium silicide layer 20 migrates deep into the substrate 10 producing a number of silicided filaments 26 (i.e., produced in the main diffusion region 14 and near the LDD region 12). Unfortunately, these silicided filaments 26 may be responsible for degrading the performance characteristics of the I/O region devices as well as the chip itself. The degraded performance typically results in junction shorts and excessive current leakage. These degrading characteristics may also be a result of current crowding in the low resistance titanium silicide layer 20.

A further disadvantage that is a result of the salicided process is that a number of high value resistors are needed in the I/O region and the core to complete many of the circuit interconnections. As is well known in the art, a resistor may be defined along the polysilicon gate 18 itself, and in the diffusion regions 14 between contacts 24 and the polysilicon gate 18. However, because the salicided process acts to effectively reduce the resistance for those regions covered by titanium silicide layer 20, it becomes necessary to design exceedingly long features to attain a higher resistance. By way of example, a 1000 resistor, typically used in analog circuits, would require a long length of 333 squares in a salicide process with sheet resistance 3 ohms/square.

To avoid having to increase the chip size to commercially unacceptable proportions, designers have been implementing a "silicide exclusion" process in an effort to increase the resistance of the polysilicon gates 18 and the diffusion regions 14. By way of example, when a silicide exclusion process is used to avoid forming titanium silicide over the polysilicon gates 18 and the diffusion regions 14, the resistance of these regions can be increased from about 3 ohms per square (with overlying titanium silicide) to about 100 ohms per square (without the overlying titanium silicide). Although the resistance values may be increased for these regions by employing the silicide exclusion process, this process has been associated with a number of highly disadvantageous side effects.

In a silicide exclusion process, before the titanium silicide layer 20 is formed, a blanket layer of oxide is deposited over the entire wafer being processed. Once blanketed, the oxide is patterned and etched to remove oxide from those regions where titanium silicide is desired, while leaving oxide over those regions where a higher sheet resistance is desired. In this manner, increased sheet resistance may be obtained in the I/O region where ESD protection is needed, as well as selected core regions where higher value resistors having small feature sizes are desired. While the silicide exclusion process provides some useful aspects, there are a number of substantial device damaging side effects that are inherently introduced by this process.

As mentioned above, silicide will not form over regions covered with oxide, and therefore, when a silicide exclusion process is used to selectively generate higher resistive regions, oxide over etching is often necessary to clear the oxide where silicide formation is required. That is, a second mask is used to leave oxide in certain regions, while other areas are exposed for oxide etching. These regions will define the desired higher valued resistors. Unfortunately, when the oxide material is over etched, many times the oxide spacers 19 are substantially removed (i.e., functionally damaged) to the level where device malfunctions such as voltage shorts and leakage currents between the diffusion regions 14 and polysilicon gate 18 occur. Of course, when device shorts occur, the entire chip is likely to fail for its intended purpose, and thereby cause substantial loss in yield and throughput. Further, if the oxide is not completely removed in the etched areas, silicide formation is retarded, resulting in high resistance in areas where silicide formation was desired.

Accordingly, in view of the foregoing, there is a need for a method of fabricating semiconductor devices that include high resistive regions not including a silicided layer, while providing the reduced resistivity silicide over other speed sensitive devices on the same chip. There is also a need for structures incorporating the high resistive structures in ESD sensitive input/output regions of a semiconductor chip.

SUMMARY OF THE INVENTION

Broadly speaking, the present invention fills these needs by providing high resistive structures in salicided process semiconductor devices, and methods for fabricating the same high resistive structure in the core region of a semiconductor chip as well as selected I/O regions where high resistive ESD circuits are often needed. It should be appreciated that the present invention can be implemented in numerous ways, including as a process, an apparatus, a system, a device, or a method. Several inventive embodiments of the present invention are described below.

In one embodiment, a resistor formed in a semiconductor device fabricated through a salicided process is disclosed. The resistor includes a substrate having at least one active device including diffusion regions and a polysilicon gate structure. The resistor further includes a patterned silicide layer defined over the substrate, and the patterned silicide layer defines non-silicided covered regions and silicided covered regions such that at least one high resistive structure is outlined by the non-silicided covered regions.

In another embodiment, a method for making a high resistive structure in a salicided process is disclosed. The method includes providing a substrate including at least one active device having diffusion regions and a polysilicon gate structure. Depositing a metallization layer over the substrate including at least one active device. Annealing the substrate to cause at least part of metallization layer to form a metallization silicided layer over the substrate that includes the at least one active device. Preferably, the metallization silicided layer lying over the diffusion regions and the polysilicon gate produces a substantially decreased level of sheet resistance. The method also includes forming a mask over the metallization silicided layer, and the mask being configured to leave a portion of the metallization silicided layer that overlies at least one active device exposed. Further, the method includes etching the substrate in order to remove the exposed metallization silicided layer overlying the at least one active device to produce a substantially increased level of sheet resistance over the at least one active device not having the metallization silicided layer.

Advantageously, the process for making high resistive structures in semiconductor devices avoids the destructive drawbacks of the prior art silicide exclusion process. For example, the sheet resistance resulting in accordance with one embodiment of the present invention is sufficiently high such that less chip surface area is needed to design the type of high resistive structures often needed in for ESD circuits designed around the periphery of a semiconductor chip as well as in the core region. Further yet, the high resistive structures are efficiently fabricated without causing the destruction of oxide spacers of active devices which could potentially cause leakage currents and electrical shorts. As a further advantage, the structure of the present invention ensures that the high resistive structures are more resistant to the formation of silicided filaments when exposed to high voltage and current events while simultaneously providing a reduced resistivity silicide over other speed sensitive devices on the same chip. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 4 shows the substrate of FIG. 3 after a photoresist mask has been applied and patterned over the silicided metallization layer in accordance with one embodiment of the present invention.

FIG. 5 shows the substrate of FIG. 4 after an etching operation is performed to remove any exposed silicided metallization not protected by a photoresist mask in accordance with one embodiment of the present invention.

DETAILED DESCRIPTION OF THE PREFERRED EMBODIMENTS

An invention for a semiconductor structure having a high resistive structure fabricated in a salicided process, and methods for fabricating the same high resistive structure in the core region of a semiconductor chip as well as selected chip periphery input/output regions where high resistive ESD resilient circuits are desirable. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

As is well known in the art, the resistivity of a material is typically referred to in terms of "sheet resistance." Sheet resistance is expressed in terms of ohms per square, and therefore, designers are able to design varying valued resistor structures by patterning a resistive material having a particular sheet resistance in a variety of different shapes designed to fit well within a particular design layout. By way of example, the resistance "R" of a patterned shape is determined by multiplying the ratio of ("length"/"width") by the resistivity expressed in terms of sheet resistance (i.e., $R=[(L/W)\square * \Omega/\square]=\Omega$).

Accordingly, when the sheet resistance of a particular material is fixed, the only way to increase the resistance of a particular patterned resistive structure is to reduce the width and increase the length. However, there are usually minimum width requirements to meet circuit load demands or ESD circuit requirements. Accordingly, chip designers are generally required to design very long resistive structures that eat up valuable chip space. In one embodiment of the present invention, the need for increased sheet resistances in chips implementing a salicided process is met by providing a method and apparatus for fabricating high resistive structures that require less layout space and are made with fewer process operations. In the following examples, it should be understood that the described resistive structures are well suited for implementation in both the input/output band of a chip where high ESD resistive structures are needed, as well as in the core area of the chip.

Figure 1:
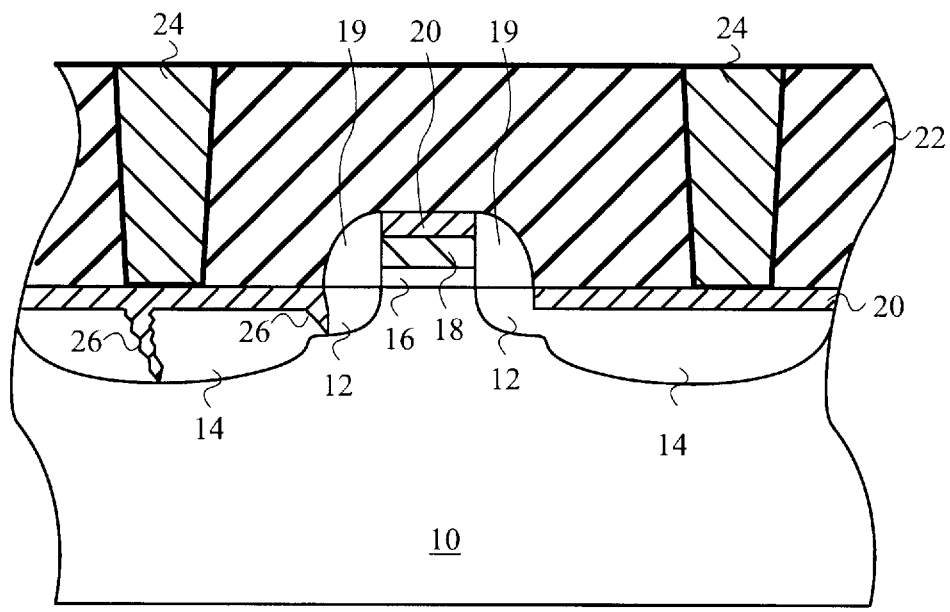
FIG. 1 is a cross sectional view of a conventional device that has been subjected to the aforementioned salicided process.
Figure 2:
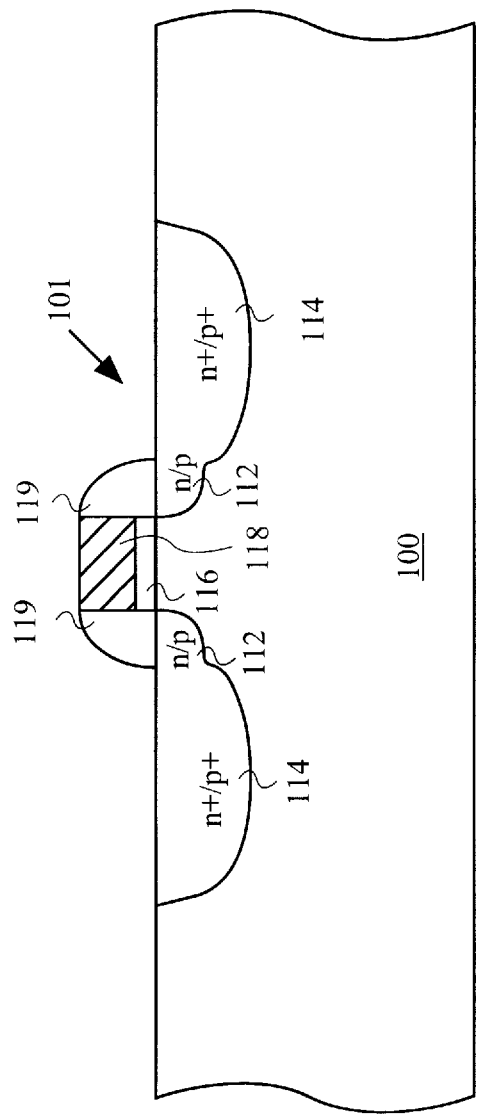
FIG. 2 is a cross sectional view of a substrate having an active device formed thereon in accordance with one embodiment of the present invention.

With this in mind, FIG. 2 is a cross sectional view of a substrate 100 having an active device 101 formed thereon in accordance with one embodiment of the present invention. As shown, active device 101 has a pair of diffusion regions 114 and a pair of lightly doped drains (LDDs) 112. In this embodiment, the LDDs 114 were preferably formed by implantation before a pair of oxide spacers 119. The active device 101 formed on substrate 100 also includes a gate oxide 116 and a polysilicon gate 118. In general, substrate 100 may be a p-type or an n-type substrate and diffusion regions 114 may be formed by implanting n+ dopants (e.g., arsenic, phosphorous, etc.) or p+ dopants (e.g., boron), respectively, followed by a conventional high temperature annealing process to assist in stabilizing the implanted impurities.

In a preferred embodiment, the n+ dopant impurities may have a concentration of between about $1\times10^{16}$ atoms cm$^{-3}$ and about $1\times10^{21}$ atoms cm$^{-3}$, and most preferably about $1\times10^{20}$ atoms cm$^{-3}$ near the surface of substrate 100. Similarly, if p-type dopants are used, the p+ dopant impurities will preferably have a concentration of between about $1\times10^{16}$ atoms cm$^{-3}$ and about $1\times10^{21}$ atoms cm$^{-3}$, and most preferably about $5\times10^{19}$ atoms cm$^{-3}$ near the surface of substrate 100. Once the substrate 100 has been processed to include at least one active device 101 as described above, the substrate is processed through a salicided process to reduce the resistivity of speed sensitive devices, e.g., such as high speed digital circuits designed in the core of the semiconductor chip.

Figure 3:
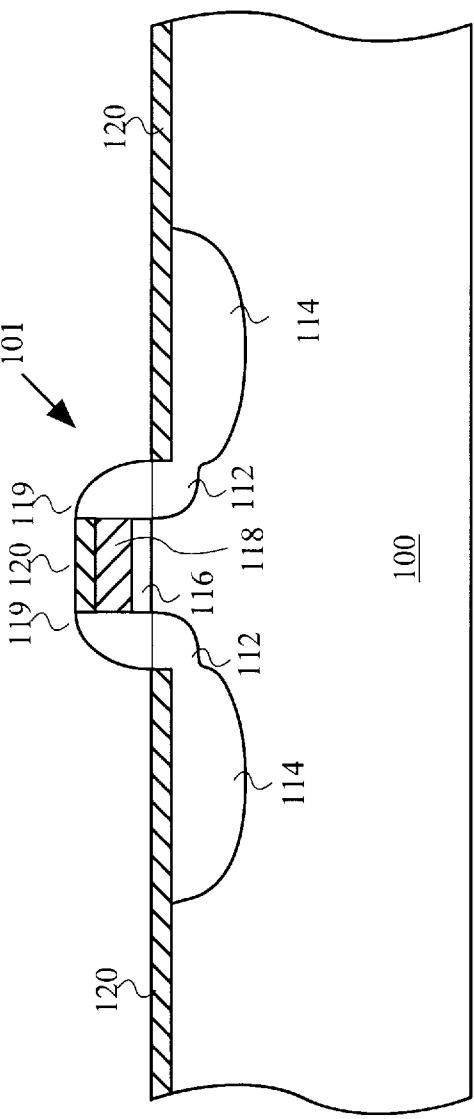
FIG. 3 shows the substrate of FIG. 2 after a salicided process has been performed in accordance with one embodiment of the present invention.

FIG. 3 shows the substrate 100 of FIG. 2 after a salicided process has been performed in accordance with one embodiment of the present invention. In this embodiment, the preferred metallization deposited to form a silicided metallization layer 120 is titanium (thereby forming TiSi$_2$), although other suitable metallizations such as cobalt and nickel may be used in a salicided process to form CoSi$_2$ and NiSi, respectively. As such, to form the illustrated silicided metallization layer 120 over substrate 100, diffusion regions 114 and polysilicon gate 118, the salicided process includes initially depositing titanium to a thickness of between about 150 angstroms and about 1000 angstroms, and more preferably between about 250 angstroms and about 750 angstroms, and most preferably about 500 angstrom over the entire substrate.

Once deposited, the substrate is subjected to a rapid thermal anneal (RTA) which subjects the entire wafer to a temperature of about 650 degrees Celsius for about thirty seconds to allow most of the titanium that is in close contact with substrate 100 to fuse into the silicon of diffusion regions 114, LDDs 112 and polysilicon gate 118, thereby producing a layer of titanium silicide (TiSi$_2$). Once a titanium silicide layer is produced over the substrate 100, a wet etch, that includes water (H$_2$O): hydrogen peroxide (H$_2$O$_2$): and ammonium hydroxide (NH$_4$OH) in a preferred ratio 5:1:1, is performed to selectively etch away any unreacted titanium lying over a lower layer of TiSi$_2$. In one embodiment, the remaining layer of TiSi$_2$ has a thickness of between about 150 angstroms and about 1000 angstroms, and most preferably about 500 angstroms.

After the wet etch of H$_2$O:H$_2$O$_2$: NH$_4$OH is complete, a silicided metallization layer 120 will remain over substrate 100, however, no titanium silicide is formed over oxide spacers 119 because oxide is not susceptible to the silicided process. Next, the substrate 100 is subjected to a second rapid thermal anneal (RTA) at a higher temperature ranging up to about 1000 degrees Celsius to assist in transforming the silicide metallization 120 into a less resistive atomic phase. By way of example, after the second rapid thermal anneal, the sheet resistance of silicided metallization 120 may be between about 1.5 ohms per square and about 10 ohms per square, and most preferably about 3 ohms per square (e.g., $15\times10^{-6}$ ohms cm).

FIG. 4 shows the substrate 100 of FIG. 3 after a photoresist mask has been applied and patterned over the silicided metallization layer 120 in accordance with one embodiment of the present invention. In this embodiment, a photoresist mask 150 is patterned such that selected pads of silicided metallization 120 remain after a wet etch is performed to remove any exposed silicided metallization layer 120. By way of example, because improved electrical contacts are established when subsequently defined vias are defined in contact with silicided metallization 120, it is usually preferable to leave a pad of silicided metallization 120 over at least part of diffusion regions 114. Of course, in other areas of the semiconductor chip where high speed low resistance devices are desired, the photoresist mask 150 will preferably protect all of the silicided metallization 120 during the etching operation.

In this example, two exemplary protective photoresist patterns remain over diffusion regions 114 for making subsequent electrical contacts to the drain/source of active device 101. The preferred etchant is preferably a dilute hydrofluoric acid (HF) that has a concentration ratio of between about 125:1 and about 25:1, and more preferably between about 100:1 and about 35:1, and most preferably about 50:1. Therefore, for the most preferred concentration ratio, for every 1 part of HF, 50 parts of deionized water are used. As such, the resulting etch rate will preferably be between about 10 and about 30 angstroms per second, and more preferably, between about 15 and about 25 angstroms per second, and most preferably about 20.5 angstroms per second. Accordingly, the implemented etchant and preferred concentration will selectively etch about 20.5 angstroms per second over the titanium silicide, while only etching exposed oxide at about 1 angstrom per second. Of course, other etchant chemicals such as buffered oxide etch (HF, NH$_3$F) may be used as well for selectively etching other metalization layers.

FIG. 5 shows the substrate 100 of FIG. 4 after the etching operation is performed to remove any exposed silicided metallization 120 not protected by photoresist mask 150. Once the etch process is complete, the patterned photoresist mask 150 is removed using a conventional photoresist removal process, leaving the structure illustrated in FIG. 5. As described above, titanium silicided pads 120a remain over diffusion regions 114 to ensure good electrical contact for a subsequently formed contacts to the diffusion regions 114. Also remaining is titanium silicide pads 120b lying approximately over the LDD regions 112 and next to the oxide spacers 119.

A pad of titanium silicided 120c will also remain over the polysilicon gate 118 after photoresist mask 150 is removed. As shown, there is now sufficient space over diffusion regions 114, over which high resistance structures may lie without having the overlying resistance inhibiting silicided metallization layer 120. In addition, when substantially all of the silicided metallization 120 is removed from over the diffusion regions 114, the resistive structure defined over diffusion regions 114 will be well suited for used in the input/output band of a semiconductor chip, where high resistive devices implemented in electrostatic discharge "ESD" circuits are desirable. Of course, these high resistive devices may also be patterned in various locations throughout the core region of a semiconductor chip.

Figure 6:
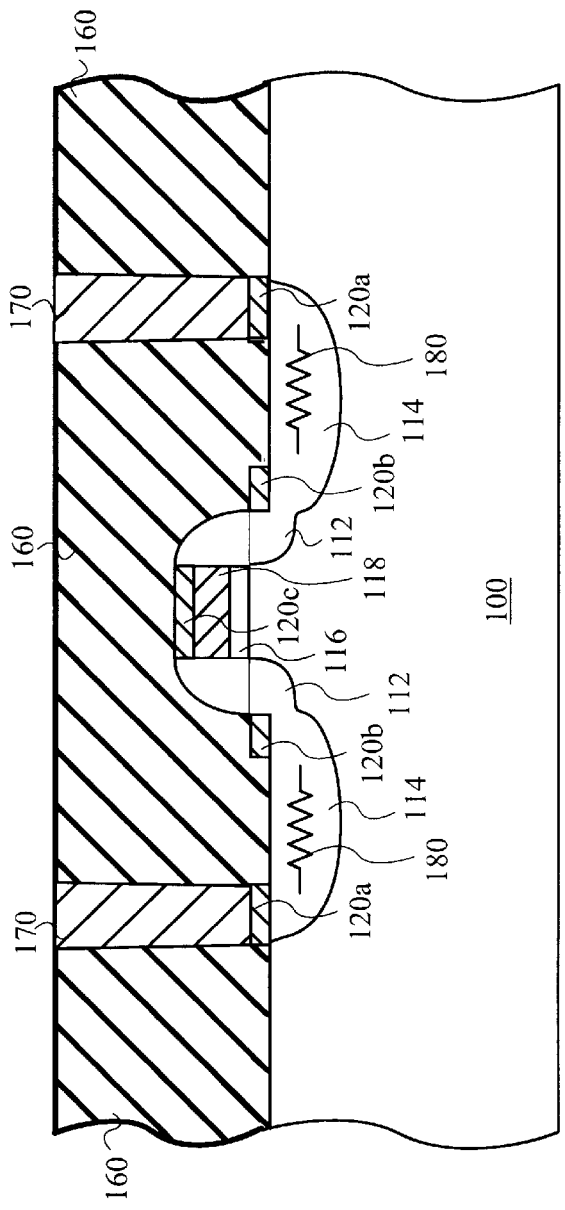
FIG. 6 is a cross sectional view of the substrate of FIG. 5 after an inter-metal oxide layer "IMO" has been deposited over the entire surface of the substrate in accordance with one embodiment of the present invention.

FIG. 6 is a cross sectional view of substrate 100 of FIG. 5 after an inter-metal oxide "IMO" 160 has been deposited over the entire surface of the substrate in accordance with one embodiment of the present invention. After the inter-metal oxide 160 is deposited, via holes are patterned and etched down to the titanium silicided pads 120a lying over diffusion regions 114. Once the via holes are defined, any suitable metallization fill technique may be used, such as tungsten plugs or aluminum fill to complete electrical contacts 170.

After electrical contacts 170 are formed, a suitable substrate planarization technique, such as chemical mechanical polishing (CMP) or any other suitable technique, may be used to planarize the substrate. Once planarized, additional metallization interconnect layers may be formed to complete the routing necessary to complete either the ESD resilient circuitry in the input/output band, or circuits lying within the core region of the semiconductor chip. As illustrated, a graphical representation of a resistor 180 is shown to indicate that substantially higher resistances that may be achieved over the surface of diffusion regions 114 for completing any desired high resistive structures using substantially less chip space than would be required when defining resistive structures over silicided surfaces.

1. Experimental Example A

In one experimental example, when diffusion regions 114 are n+ doped diffusion regions implanted with arsenic (As) atoms, the resulting sheet resistance obtained in accordance with one embodiment of the present invention was about 253.75 ohms per square. As summarized in table A below, the applied implant concentration and implant energy was set to about $2 \times 10^{15}$ atoms $cm^{-2}$ and 60 kilo electron volts, respectively. The thickness of the deposited titanium material was preferably about 350 angstroms. The first rapid thermal anneal (RTA) was preferably performed at about 720° C. for about 30 seconds. After the first RTA, a wet $H_2O:H_2O_2:NH_4OH$ etch is performed by submerging the substrate in the etching solution for about 8 minutes. Once the wet etch is performed, the second rapid thermal anneal (RTA) at about 1000° C. was performed for another 30 seconds to change the phase of the formed titanium silicide ($TiSi_2$). Once the titanium silicide is formed, the titanium silicide is patterned and removed from over those regions in which a high resistive device is desired. Although arsenic was used as the diffusion region dopant, any other dopant materials such as phosphorous may be used as well.

TABLE A

| | |
|---|---|
| n+ Dopant Implanted | Arsenic |
| Implant Concentration and Implant Energy | about $2 \times 10^{15}$ atoms $cm^{-2}$ 60 KeV |
| Thickness of Deposited Titanium | about 350 Angstroms |
| First Rapid Thermal Anneal (RTA) Temperature and Duration | about 720 degrees C. about 30 seconds |
| Wet $H_2O:H_2O_2:NH_4OH$ Etch Duration | about 8 minutes |
| Second Rapid Thermal Anneal (RTA) Temperature and Duration | about 1000 degrees C. about 30 seconds |
| Resulting Resistivity over n+ diffusion region after patterning and etching the resulting titanium silicide $H_2O:HF = 50:1$ | about 253.75 ohms per square |

As mentioned above, in this experimental example, the resistivity of the regions not having an overlying titanium silicided metallization were found to have about 253.75 ohms per square. It is believed that these advantageously elevated resistivity values are attained for at least two reasons: (i) a thin layer of diffusion region 114 consumed during the silicide formation is removed along with the etched silicided metallization layer 120 as shown in FIG. 5, and (ii) a part of the dopant in diffusion layer 114 is preferentially sucked into the silicide layer during the silicide reaction. Accordingly, these elevated resistivity values are substantially improved over those resistivity values obtained in a pure salicided process as well as those obtained in a silicide exclusion process. Although only one example has been provided for n+ diffusion regions 114, even higher resistances may be achieved over p+ diffusion regions.

Figure 7:
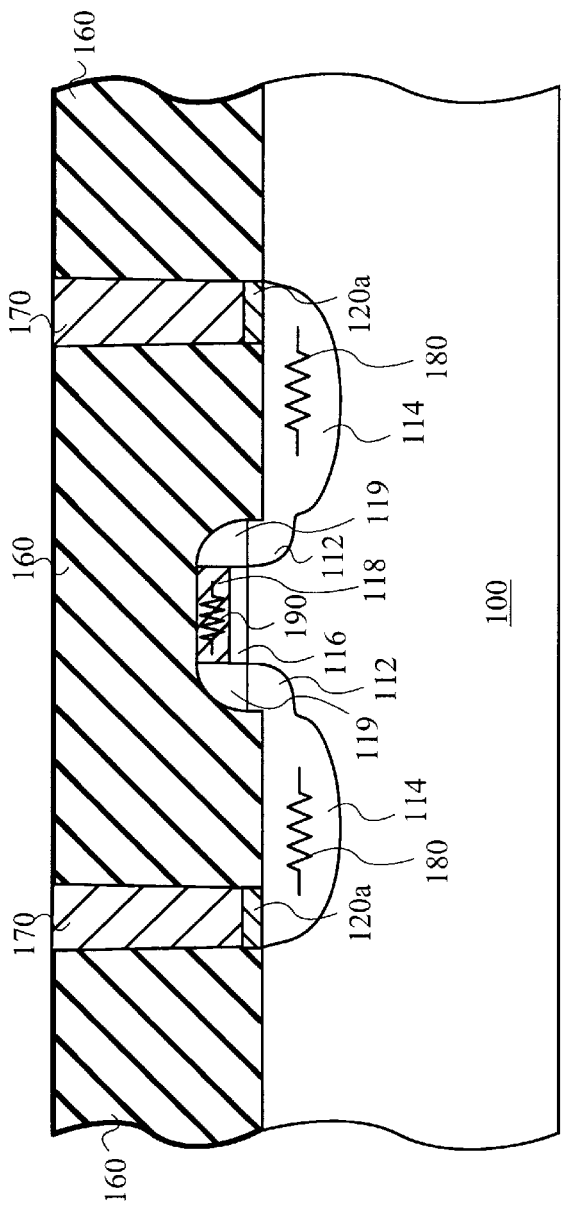
FIG. 7 illustrates a substrate having a high polysilicon gate sheet resistance processed in accordance with an alternative embodiment of the present invention.

FIG. 7 illustrates a substrate 100 processed in accordance with an alternative embodiment of the present invention. In this embodiment, the photoresist mask 150 provided over polysilicon gate structure 118 was not provided as in FIG. 4. As a result, when the selective HF etching step was performed, the titanium silicided pad 120c of FIG. 5 was removed along with the titanium silicide pads 120b lying in either side of oxide spacers 119. Because the preferred etchant is highly selective in removing titanium silicide, oxide spacers 119 will remain substantially in tack and will not be damaged. Further, in this example, once the titanium silicide metallization is removed from over polysilicon gate 118, the gate structure also becomes a suitable surface for patterning a high resistive device.

2. Experimental Example B

The following table illustrates the process conditions in which a polysilicon material similar to that of polysilicon gate 118 was processed to achieve a sheet resistance of up to about 383.30 ohms per square. In this experimental example, the polysilicon material was doped with an implant concentration of about $3 \times 10^{15}$ atoms $cm^{-2}$ with an energy level of about 60 KeV. The remaining process conditions are provided in table B below for exemplary purposes only.

TABLE B

| | |
|---|---|
| n+ Dopant Implanted | Arsenic |
| Implant Concentration and Implant Energy | about $3 \times 10^{15}$ atoms $cm^{-2}$ about 60 KeV |
| Thickness of Deposited Titanium | about 350 Angstroms |
| First Rapid Thermal Anneal (RTA) Temperature and Duration | about 720 degrees C. about 30 seconds |
| Wet Etch Duration | about 8 minutes |

TABLE B-continued

| | |
|---|---|
| Second Rapid Thermal Anneal (RTA) Temperature and Duration | about 1000 degrees C. about 30 seconds |
| Resulting Resistivity over n⁺ doped polysilicon after patterning and etching the resulting titanium silicide | about 383.30 ohms per square |

It is believed that the increased resistivity achieved through this process is in part due to the fact that a thin layer of polysilicon is removed when the wet etch is used to remove the silicided metallization from over the polysilicon. Another factor may be that part of the higher concentration dopant is removed from the polysilicon into the silicide during the silicidation reaction. In any event, substantially higher sheet resistance may be achieved through this process, which is substantially better than can be achieved using the possibly destructive silicide exclusion process or the pure salicided process. With reference to FIG. 7, it is noted that a pictorial resistor 190 is shown within polysilicon gate 118 to indicate its substantially higher sheet resistance, while maintaining the structural integrity of the oxide spacers 119.

As mentioned earlier, when a conventional silicided exclusion process is used, a layer of oxide is deposited over the entire surface of the substrate and then patterned in the form of a mask to expose those regions where silicide formation is desired. Once the salicided process is complete for those devices on the chip requiring low sheet resistivity, the oxide is patterned with a photoresist exposing regions of the oxide that overlie diffusion regions and gates where a designer may wish to design a resistive structure by etching away the oxide. Unfortunately, when the oxide is removed to pattern a resistive structure, the underlying devices may be damaged (i.e., causing shorts, leakage currents, an in-operability), and the oxide spacers may be completely over etched. Furthermore, the sheet resistance achieved by this silicide exclusion process is not as high as that attainable by implementing the process in accordance with one embodiment of the present invention.

For comparison purposes only, the table C below illustrates the substantially improved sheet resistances achieved for both diffusion regions and polysilicon gates in accordance with one embodiment of the present invention. In the first column, when the salicided process is used, prohibitively long resistor devices would have to be constructed to achieve the desired circuit operability. On the other hand, if conventional salicide exclusion processes were used, some improvement in sheet resistance may be achieved, but at the unfortunate sacrifice of introducing possible circuit malfunctions due to oxide over etching. On the other hand, the resistivity achieved in accordance with one embodiment of the present invention has been found to be as high as about 4 times in magnitude better than the silicide exclusion process, while maintaining the structural and functional integrity of the active devices formed throughout the substrate.

TABLE C

| Chip Region | Salicided Process | Silicide Exclusion Process | One Embodiment of Present Invention |
|---|---|---|---|
| Diffusion n+ | ~3–5 Ω/□ | ~60 Ω/□ | ~200 Ω/□ |
| Diffusion p+ | ~3–5 Ω/□ | ~80 Ω/□ | ~250 Ω/□ |
| Polysilicon Gate | ~3–5 Ω/□ | ~100 Ω/□ | ~350 Ω/□ |

Figure 8:
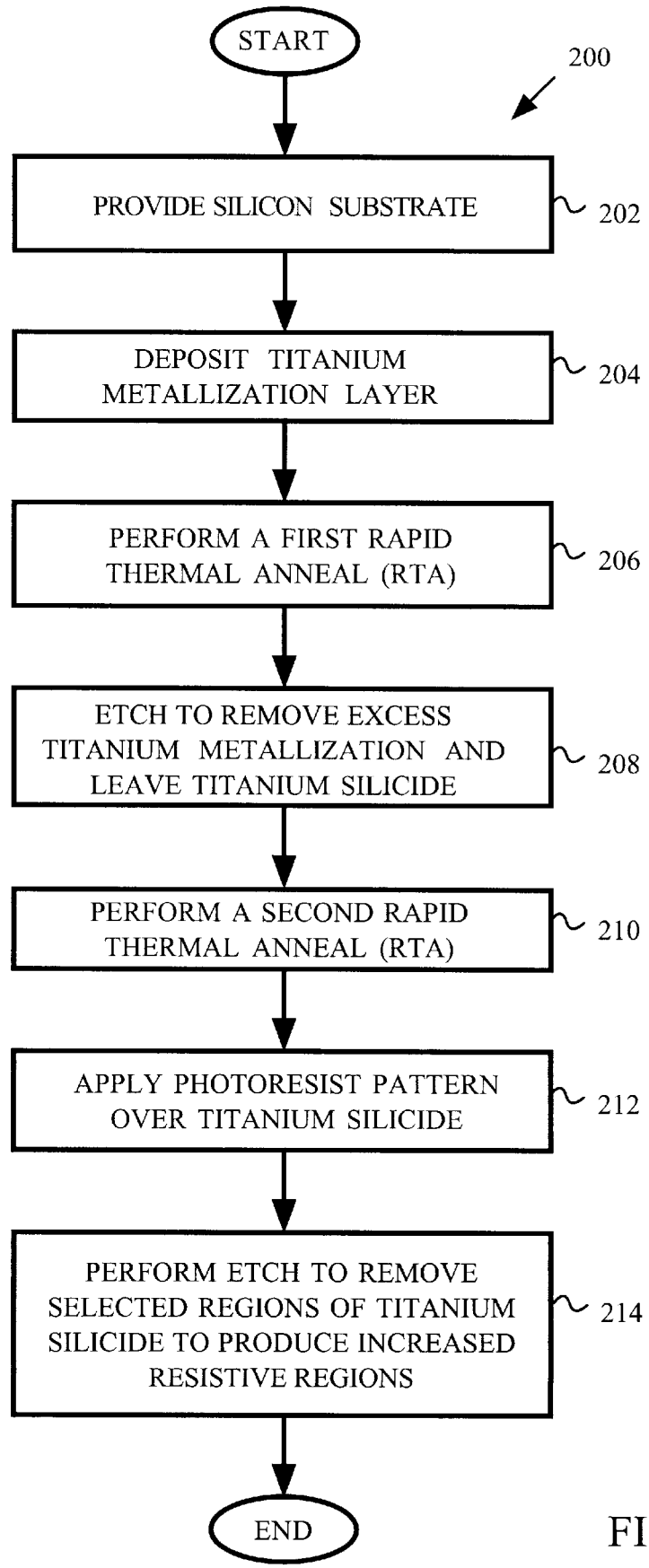
FIG. 8 is a flowchart diagram illustrating the preferred method operations implemented in fabricating high resistive structures (i.e., resistors) in accordance with one embodiment of the present invention.

FIG. 8 is a flowchart diagram illustrating the preferred method operations implemented in fabricating high resistive structures (i.e., resistors) in accordance with one embodiment of the present invention. The method begins at an operation 202 where a silicon substrate is provided having at least one active device formed thereon. Typically, the substrate is part of a fabricated silicon wafer that is partitioned into a many identical semiconductor chips. As described above, the active device may be formed in the input/output band along the periphery of the chip, and may be particularly well suited for designing electrostatic discharge ESD circuitry, or a circuit designed in part of a chip core region. Once the silicon substrate is provided in operation 202, the method will proceed to an operation 204 where a titanium metallization layer is deposited over the substrate including any active devices formed thereon.

As mentioned above, the titanium is preferably deposited to a thickness of between about 150 angstroms and about 1000 angstroms, and more preferably between about 250 angstroms and about 750 angstroms, and most preferably about 500 angstrom over the entire substrate. Once the titanium metallization layer has been deposited to a suitable thickness, the substrate is placed into a furnace in which a rapid thermal anneal (RTA) process is performed for about 30 seconds. When the substrate is elevated to a temperature of about 650 degrees Celsius, the previously deposited titanium metallization material begins to combine with the silicon substrate and possibly, a polysilicon gate of the active device. Once annealed, the method proceeds to an operation 208 where a wet etch is performed to remove any excess titanium metallization material that did not combine into the substrate to create titanium silicide.

In the next step, the substrate is again placed into a furnace where a second rapid thermal anneal (RTA) is performed, which may range in temperatures up to 1,000° C. to assist in changing the atomic phase of the silicided structure formed on the substrate, thereby reducing the resistivity of the formed silicide. After the second RTA is performed, the resistivity of the silicided metallization may be as low as to about 1 to 3 ohms per square. In this manner, the low resistance of the titanium silicide will benefit those regions of the semiconductor chip implementing high speed digital processing. Once the second rapid thermal anneal has been performed in operation 210, the method will proceed to an operation 212 where a photoresist pattern is formed over the titanium silicide material.

In this embodiment, the pattern is preferably designed to leave exposed those regions of titanium silicide metallization in which high resistive structures will subsequently remain after a subsequent etch operation is performed. By way of example, the method will proceed to operation 214 where a dilute hydrofluoric acid (HF) etching step is performed to remove those selected regions of titanium silicide to produce the advantageously high resistive structures. As described above, the wet etchant is preferably a dilute hydrofluoric acid having a concentration ratio of about 50:1, where for every 1 part of hydrofluoric acid, 50 parts of deionized water are used. As a result, an etch rate of about 20 angstroms per second is achieved over substantially all exposed titanium silicide regions (i.e., regions not covered by the photoresist mask). Once etching is complete, any remaining backside processing may be performed to sputter any metallization needed for interconnect lines, and deposit additional inter-metal oxides to complete a desired circuit.

Figure 9:
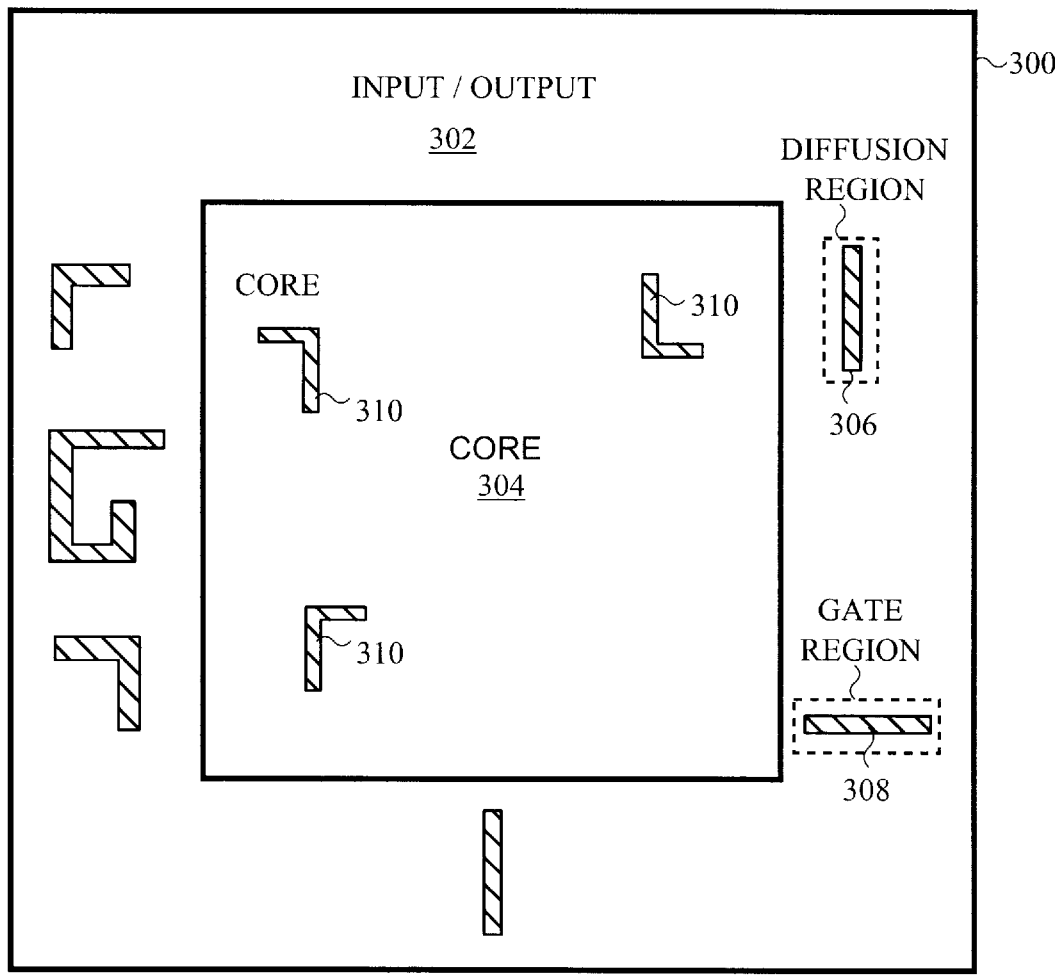
FIG. 9 is a topside view of a semiconductor chip having an input/output region defined along the periphery and a core region in accordance with one embodiment of the present invention.

FIG. 9 is a topside view of a semiconductor chip 300 having an input/output region 302 defined along the periphery of the semiconductor chip. As is well known in the art, input/output (I/O) 302 may contain a number of circuits including buffers, drivers, pre-drivers, transceivers, various other logic circuits, etc. Further, in accordance with one particularly advantageous feature of the present invention, high resistance structures may be well suited for designing ESD circuitry in the I/O 302 of semiconductor chip 300. As described above, the ESD circuitry is well suited to protect the internal core logic from high voltage and current events that may damage the functional and structural integrity of a chip.

By way of example, once the diffusion regions or gate regions in which high resistive structures are desired to be formed over are identified, the designer may simply pattern (i.e., with photoresist or any other mask) a resistor feature, and etch the exposed titanium silicide material lying within those patterned regions. As an example, these highly resistive structures may include a high valued resistor 306 patterned over a diffusion region in the input/output 302. Also shown is a high resistive value resistor 308 patterned over a gate region (i.e., such as polysilicon gate 118), or high resistive structures formed in various locations throughout core 304.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for making a high resistive structure in a salicided process, comprising:

providing a substrate including at least one active device having diffusion regions within the substrate and a polysilicon gate structure on the substrate;

depositing a metallization layer over the substrate including the at least one active device;

annealing the substrate to cause at least part of the metallization layer to form a metallization silicided layer over and within the substrate that includes the at least one active device, the metallization silicided over and within the diffusion regions and over the polysilicon gate producing a substantially decreased level of sheet resistance;

forming a mask over the metallization silicided layer, the mask being configured to leave a portion of the metallization silicided layer that overlies and is within the diffusion regions of the at least one active device exposed, and a conductive contact pad of the metallization silicided layer that overlies and is within the diffusion regions protected for subsequent electrical contact; and etching the substrate in order to remove the exposed metallization silicided layer overlying the at least one active device to produce a substantially increased level of sheet resistance over the at least one active device not having the metallization silicided layer, the substantially increased level of sheet resistance thereby producing a high value resistor that can act as an electrostatic discharge ballast resistor over part of the diffusion regions or part of the polysilicon gate structure.

2. A method for making a high resistive structure in a salicided process as recited in claim 1, further comprising:

depositing an oxide layer over the substrate having the high value resistor; and forming electrical contacts through the oxide layer to make contact with at least one of the diffusion regions and the polysilicon gate structure having the designed high value resistor.

3. A method for making a high resistive structure in a salicided process as recited in claim 2, wherein the forming of the electrical contacts to make contact with the diffusion regions is configured to make electrical contact with the conductive contact pad of the metallization silicided layer that overlies and is within the diffusion regions.

4. A method for making a high resistive structure in a salicided process as recited in claim 1, wherein the electrostatic discharge ballast resistor is defined in an input/output periphery of a semiconductor chip.

5. A method for making a high resistive structure in a salicided process as recited in claim 4, wherein the electrostatic discharge ballast resistor designed over part the diffusion regions of the at least one active device not having the metallization silicided layer has a resistivity of between about 130 ohms per square and 280 ohms per square.

6. A method for making a high resistive structure in a salicided process as recited in claim 5, wherein when the diffusion regions are n-type diffusion regions, the resistivity is about 200 ohms per square.

7. A method for making a high resistive structure in a salicided process as recited in claim 5, wherein when the diffusion regions are p-type diffusion regions, the resistivity is about 250 ohms per square.

8. A method for making a high resistive structure in a salicided process as recited in claim 5, wherein when the electrostatic discharge ballast resistor is designed over the polysilicon gate structure of the at least one active device not having the metallization silicided layer, the resistivity is between about 320 ohms per square and about 427 ohms per square.

9. A method for making a high resistive structure in a salicided process as recited in claim 1, wherein the metallization layer is selected from the group consisting of titanium, cobalt and nickel.

10. A method for making a high resistive structure in a salicided process as recited in claim 9, wherein the metallization silicided layer is selected from the group consisting of titanium silicide, cobalt silicide and nickel silicide.

11. A method for making a high resistive structure in a salicided process as recited in claim 10, wherein the etching is performed with a dilute hydrofluoric acid having a concentration between about 25:1 and about 125:1, and is configured to be high selective in etching the metallization silicide.

12. A method for making a high resistive structure in a salicided process as recited in claim 11, wherein the concentration provides an etch rate of between about 10 and about 30 angstroms per second.

13. A method for making an electrostatic discharge ballast resistor, the electrostatic discharge ballast resistor being made on a substrate that has a transistor device that includes diffusion regions within the substrate and a polysilicon gate structure on the substrate, the method including:

depositing a metallization layer over the substrate including the transistor device;

annealing the substrate to cause at least part of the metallization layer to form a metallization silicided layer over and within the substrate that includes the transistor device, the formed metallization silicided layer producing a substantially decreased level of sheet resistance;

forming a photoresist mask over the metallization silicided layer, the photoresist mask exposing a portion of the metallization silicided layer that overlies and is within one of the diffusion regions, the photoresist mask further being configured to cover a conductive contact pad that is defined by a portion of the metallization silicided layer that overlies the one of the diffusion regions for subsequent electrical contact; and etching the substrate in order to remove the exposed portion of the metallization silicided layer that overlies and is within the one of the diffusion regions, the etching thereby producing a substantially increased level of sheet resistance over the one of the diffusion regions where the metallization silicided layer was removed, thereby forming the electrostatic discharge ballast resistor.

14. A method for making an electrostatic discharge ballast resistor as recited in claim 13, further comprising:

depositing an oxide layer over the substrate having the electrostatic discharge ballast resistor; and forming electrical contacts through the oxide layer.

15. A method for making an electrostatic discharge ballast resistor as recited in claim 14, wherein the forming of the electrical contacts is configured to make at least one electrical connection to the conductive contact pad of the metallization silicided layer.

16. A method for making an electrostatic discharge ballast resistor as recited in claim 13, wherein the etching is performed with a dilute hydrofluoric acid having a concentration between about 25:1 and about 125:1, and is configured to be highly selective in etching the metallization silicide.

17. In a substrate including a transistor device that has diffusion regions within the substrate and a polysilicon gate structure on the substrate, a metallization silicided layer being defined over and within the substrate including the transistor device, the metallization silicided layer defining a substantially decreased level of sheet resistance, a method for making a high resistive structure comprising:

forming a photoresist mask over the metallization silicided layer, the photoresist mask exposing a portion of the metallization silicided layer that overlies and is within one of the diffusion regions, the photoresist mask further being configured to cover a conductive contact pad that is defined by a portion of the metallization silicided layer and at least partially overlies the one of the diffusion regions for subsequent electrical contact; and etching the substrate in order to remove the exposed portion of the metallization silicided layer that overlies and is within the one of the diffusion regions, the etching thereby producing a substantially increased level of sheet resistance over the one of the diffusion regions where the metallization silicide layer was removed, thereby forming the high resistive structure, having a resistivity of between about 130 ohms per square and 280 ohms per square.

18. The method for making a high resistive structure as recited in claim 17, further comprising:

depositing a dielectric layer over the substrate having the high resistive structure; and forming electrical contacts through the dielectric layer.

19. The method for making a high resistive structure as recited in claim 18, wherein the forming of the electrical contacts is configured to make at least one electrical connection to the conductive contact pad of the metallization silicided layer.

20. The method for making a high resistive structure as recited in claim 17, wherein the etching is performed with a dilute hydrofluoric acid having a concentration between about 25:1 and about 125;1, and is configured to be highly selective in etching the metallization silicide.

21. The method for making a high resistive structure as recited in claim 17, wherein the high resistive structure is an electrostatic discharge ballast resistor.

* * * * *